United States Patent [19]

Okikawa et al.

[11] Patent Number: 5,252,700
[45] Date of Patent: Oct. 12, 1993

[54] HEAT-RESISTANT ADHESIVE AND METHOD OF ADHESION BY USING ADHESIVE

[75] Inventors: Hideaki Okikawa; Shoji Tamai; Katsuaki Iiyama; Saburo Kawashima; Akihiro Yamaguchi; Tadashi Asanuma, all of Kanagawa, Japan

[73] Assignee: Mitsui Toatsu Chemicals, Inc., Tokyo, Japan

[21] Appl. No.: 871,517

[22] Filed: Apr. 21, 1992

[30] Foreign Application Priority Data

Apr. 30, 1991 [JP] Japan .................................. 3-98647
Mar. 3, 1992 [JP] Japan .................................. 4-45248

[51] Int. Cl.$^5$ ..................... C08G 69/26; C08G 73/10; C08G 63/00
[52] U.S. Cl. .................................. 528/353; 524/6.7; 524/879; 525/326.7; 525/928; 528/170; 528/184; 528/185; 528/318; 528/322; 528/344; 528/363; 427/385.5
[58] Field of Search .............. 524/607, 879; 528/170, 528/318, 322, 344, 363, 184, 185, 353; 427/385.5; 525/326.7, 928

[56] References Cited

U.S. PATENT DOCUMENTS 4,337,110  6/1982  Antonoplos et al. ............... 524/879
5,147,966  9/1992  St. Clair et al. .................... 524/607

FOREIGN PATENT DOCUMENTS 368590  5/1990  European Pat. Off. .

OTHER PUBLICATIONS

Patent Abstracts of Japan, vol. 11, No. 163 & JP-6-1-291670.

*Primary Examiner*—Paul R. Michl
*Assistant Examiner*—Tae H. Yoon
*Attorney, Agent, or Firm*—Burns, Doane, Swecker & Mathis

[57] ABSTRACT

The heat resistant adhesive of the invention comprises polyamic acid and/or polyimide which are prepared by using 1,3-bis(3-aminophenoxy)benzene as an aromatic diamine component and 3,3',4,4'-biphenyltetracarboxylic dianhydride, 3,3',4,4'-benzophenonetetracarboxylic dianhydride and/or 3,3',4,4'-diphenylethertetracarboxylic dianhydride as tetracarboxylic acid dianhydrides, and further by blocking the polymer chain end with dicarboxylic anhydride or a monoamine compound; or comprises a polyimide solution containing the polyimide in a good solvent.

The adhesive of the invention is a heat-resistant adhesive capable of adhering under mild temperature/mild pressure conditions. The adhesive of polyimide solution can provide desired adhesion by simple procedures such as applying to the adherend and heating under pressure and exhibits excellent adhesive strength. Consequently, the heat-resistant adhesive of the invention is very useful for the adhesion of structural and electronic materials and other industrial materials.

9 Claims, No Drawings

HEAT-RESISTANT ADHESIVE AND METHOD OF ADHESION BY USING ADHESIVE

BACKGROUND OF THE INVENTION

1. Field of the Invention

The present invention relates to a heat-resistant adhesive and a method of adhesion by using the adhesive. More particularly, the invention relates to a polyimide-base adhesive which can adhere under mild temperature and pressure conditions, is extremely excellent in adhesion properties and heat resistance in particular, and can be used in the electric and electronics fields, and to a method of adhesion by using the adhesive.

2. Related Art of the Invention

Many heat-resistant adhesives composed of synthetic organic high polymers have conventionally been known as adhesives for various high performance materials used in the fields of electronics, space and aeronautic equipment and transfer machinery. Adhesives which have high heat resistance are polybenzoimidazole-based and polyimide-based adhesives.

Particularly, polyimide-based heat-resistant adhesives which have excellent heat resistance and adhesive strength have been disclosed in U.S. Pat. No. 4,065,345 and Japanese Laid Open Patent Sho 61-143,477. Although these heat-resistant adhesives are excellent in heat resistance and adhesive strength, adhesion must be carried out at high temperature under high pressure in order to obtain high adhesive strength.

When these polyimide-based adhesives are used, a solution of polyamic acid precursor is applied to an adherend surface, subjected to solvent removal and imidization, dried, and adhered to another substrate at high temperature under high pressure. Alternatively, polyimide is processed into films or purified by separating in the form of powder, followed by inserting between the two adherend and adhering at high temperature under high pressure.

Polyimide is a high heat-resistant polymer material obtained by polycondensation of aromatic diamine and aromatic tetracarboxylic dianhydride, and many kinds of polyimide have been known.

Polyimides obtained by using 1,3-bis(3-aminophenoxy)benzene as a diamine component have been known, for example, as follows.

(1) An acetylene radical terminated polyimide oligomer prepared from 1,3-bis(3-aminophenoxy)benzene, 3,3',4,4'-benzophenone tetracarboxylic dianhydride and 3-aminophenylacetylene(N. Bilow et al. U.S. Pat. No. 3,845,018 and 3,879,349).

(2) A polyimide prepared by polycondensation of 1,3-bis(3-aminophenoxy)benzene and pyromellitic dianhydride(T. P. Gannett et al., U.S. Pat. No. 4,485,140).

(3) Heat resistant adhesives prepared from 1,3-bis(3-aminophenoxy) benzene and various kinds of tetracarboxylic dianhydrides (Japanese Laid-Open Patent Sho 61-143,477 and 61-291,670).

(1) is an addition type thermosetting polyimide in which the oligomer end is blocked with a 3-aminophenylacetylene radical and the terminal acetylene radical is involved in a cross-linking reaction by heat treatment.

(2) is a condensation type polyimide obtained by using 1,3-bis(3-aminophenoxy)benzene as a raw material monomer and characterized by using pyromellitic dianhydride as a tetracarboxylic dianhydride component.

(3) are heat resistant adhesives composed of 1,3-bis(3-aminophenoxy)benzene and various kinds of tetracarboxylic dianhydrides. However, a reactive radical remains at the end of polymer chain and severe conditions such as high temperature and high pressure are required in order to obtain heat resistant adhesion.

SUMMARY OF THE INVENTION

An object of the present invention is to provide a polyimide-based adhesive which can adhere under milder conditions as compared with conventional adhesion conditions and has excellent adhesion properties, and a method of adhesion by using the adhesive, and also to provide an adhesive which does not require a complex adhering operation and an adhering method by using the adhesive.

As a result of an intensive investigation in order to accomplish the above object of the invention, the present inventors have found that the polyimide having the below described recurring structural units can perform adhesion under mild conditions such as lower temperature and lower pressure as compared with conventional polyimide-based adhesives, that the polyimide and the polyamic acid precursor can be used for the adhesive, and that further excellent adhesion properties can be obtained by using a solution containing the polyimide in an organic solvent. Thus, the present invention has been completed.

That is, one aspect of the present invention is a heat-resistant adhesive comprising polyamic acid and/or polyimide which are blocked at the polymer chain end with an aromatic dicarboxylic anhydride represented by the formula (1):

wherein Z is a divalent radical selected from the group consisting of a monoaromatic radical, condensed polyaromatic radical and noncondensed aromatic radical connected to each other with a direct bond or a bridge member, and/or an aromatic monoamine represented by the formula (3):

$$Q-NH_2 \qquad (3)$$

wherein Q is a monovalent radical selected from the group consisting of a monoaromatic radical, condensed polyaromatic radical and noncondensed aromatic radical connected to each other with a direct bond or a bridge member, and essentially consists of recurring structural units represented by the formula (2):

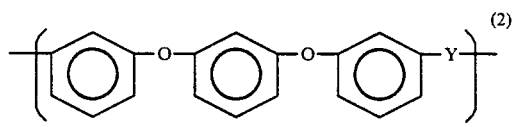

wherein Y is:

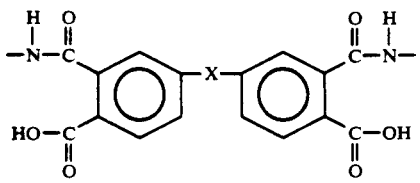

or

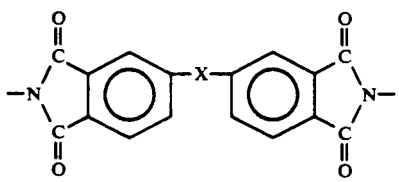

wherein X is a direct bond or a divalent radical of —CO— or —O—; a polyimide-based heat-resistant adhesive comprising an organic solvent solution of a polyimide which is blocked at the polymer chain end with an aromatic dicarboxylic anhydride represented by the formula (1):

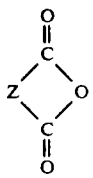 (1)

wherein Z is a divalent radical selected from the group consisting of a monoaromatic radical, condensed polyaromatic radical and noncondensed aromatic radical connected to each other with a direct bond or a bridge member, and/or an aromatic monoamine represented by the formula (3):

Q—NH$_2$ (3)

wherein Q is a monovalent radical selected from the group consisting of a monoaromatic radical, condensed polyaromatic radical and noncondensed aromatic radical connected to each other with a direct bond or a bridge member, and essentially consists of recurring structural units represented by the formula (2):

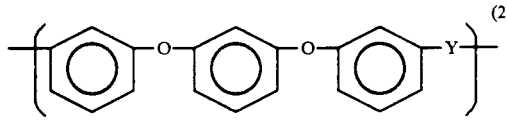 (2)

wherein Y is:

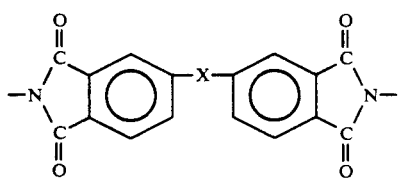

wherein X is a direct bond or a divalent radical selected from —CO— and —O—; and a method of adhesion comprising using said polyimide solution.

The polyimide which constitutes the polyimide-based heat-resistant adhesive may contain the polyamic-acid precursor in the range giving no adverse effect on the characteristics of the heat-resistant adhesive of the invention.

In the above polyamic acid or polyimide, the polymer chain end is preferably blocked in particular by using phthalic anhydride as the aromatic dicarboxylic anhydride or aniline as the aromatic monoamine.

The polyimide used for the adhesive of the invention differs from known polyimides in the following points.

The above described acetylene radical terminated polyimide oligomer (1) which is prepared from 1,3-bis(3-aminophenoxy)benzene, 3,3',4,4'-benzophenonetetracarboxylic dianhydride and 3-aminophenylacetylene differ in that the oligomer is an addition type thermosetting polyimide wherein the oligomer end is blocked with 3-aminophenyl-acetylene and the terminal acetylene radical is involved in a crosslinking reaction by heat treatment. The polycondensation type polyimide (2) which is prepared from 1,3-bis(3-aminophenoxy)benzene and pyromellitic dianhydride differs in that the tetracarboxylic acid dianhydride is pyromellitic dianhydride. The heat resistant adhesives (3) composed of 1,3-bis(3-aminophenoxy)benzene and various kinds of tetracarboxylic dianhydrides (Japanese Laid-Open Patent Sho 61-143,477 and 61-291,670) differ in that the reactive terminal radical remains at the end of the polymer chain and severe conditions such as high temperature and high pressure are required in order to obtain heat-resistant adhesion.

DETAILED DESCRIPTION OF THE INVENTION

The present invention will hereinafter be described in detail.

The polyamic acid or polyimide of the invention can be obtained by polycondensation of 1,3-bis(3-aminophenoxy)benzene as an aromatic diamine component with one or more aromatic tetracarboxylic dianhydrides selected from the group consisting of 3,3',4,4'-diphenylethertetracarboxylic dianhydride, 3,3',4,4'-benzophenonetetracarboxylic dianhydride and 3,3',4,4'-biphenyltetracarboxylic dianhydride as aromatic tetracarboxylic dianhydride components.

The polyamic acid or polyimide has its terminal reactive group at the polymer chain end blocked with an aromatic dicarboxylic anhydride represented by the formula (1):

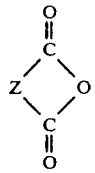 (1)

wherein Z is the same as above, or with an aromatic amine represented by the formula (3):

Q—NH$_2$ (3)

wherein Q is the same as above.

The aromatic diamine component which is used as a monomer in the invention is 1,3-bis(3-aminophenoxy)-benzene (hereinafter referred to as APB) having the formula (8):

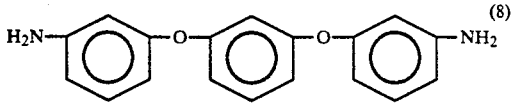

The aromatic tetracarboxylic dianhydride used as another monomer is a compound represented by the formula (9):

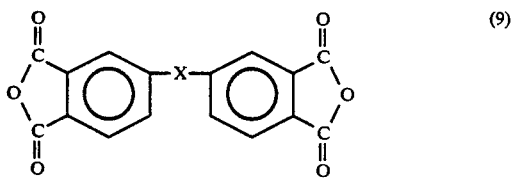

wherein X is a direct bond or a divalent radical of —CO— or —O—, and practically, 3,3',4,4'-biphenyltetracarboxylic dianhydride (hereinafter referred to as BPDA), 3,3',4,4'-benzophenonetetracarboxylic dianhydride (hereinafter referred to as BTDA) or 3,3',4,4'-diphenylethertetracarboxylic dianhydride (hereinafter referred to as ODPA). The aromatic tetracarboxylic dianhydride can be used singly or as a mixture.

The adhesive prepared from the polyamic acid and/or polyimide of the invention comprises the above aromatic diamine component and aromatic tetracarboxylic dianhydride component as primary components.

However, in the range giving no adverse effect on the characteristics of the heat-resistant adhesive of the invention, a portion of the aromatic tetracarboxylic dianhydride of the above formula (9) can be replaced without any problem by tetracarboxylic dianhydride represented by the formula (10):

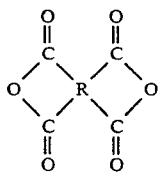

wherein R is a tetravalent radical selected from the group consisting of an aliphatic radical having two or more carbon atoms, alicyclic radical, monoaromatic radical, condensed polyaromatic radical and noncondensed aromatic radical connected to each other with a direct bond or a bridge member.

Exemplary tetracarboxylic acid dianhydrides which can replace the portion include a single compound or a mixture of compounds selected from
ethylenetetracarboxylic dianhydride,
butanetetracarboxylic dianhydride,
cyclopentanetetracarboxylic dianhydride,
pyromellitic dianhydride,
2,2',3,3'-benzophenonetetracarboxylic dianhydride,
2,2',3,3'-biphenyltetracarboxylic dianhydride,
2,2-bis(3,4-dicarboxyphenyl)propane dianhydride,
bis(3,4-dicarboxyphenyl) ether dianhydride,
bis(2,3-dicarboxyphenyl) ether dianhydride,
bis(3,4-dicarboxyphenyl) sulfone dianhydride,
bis(2,3-dicarboxyphenyl) sulfone dianhydride,
1,1-bis(2,3-dicarboxyphenyl)ethane dianhydride,
bis(2,3-dicarboxyphenyl)methane dianhydride,
bis(3,4-dicarboxyphenyl)methane dianhydride,
4,4'-(p-phenylenedioxy)diphthalic dianhydride,
4,4'-(m-phenylenedioxy)diphthalic dianhydride,
2,3,6,7-naphthalenetetracarboxylic dianhydride,
1,4,5,8-naphthalenetetracarboxylic dianhydride,
1,2,5,6-naphthalenetetracarboxylic dianhydride,
1,2,3,4-benzenetetracarboxylic dianhydride,
3,4,9,10-perylenetetracarboxylic dianhydride,
2,3,6,7-anthracenetetracarboxylic dianhydride and
1,2,7,8-phenanthrenetetracarboxylic dianhydride.

Further, a portion of APB of the formula (8) can be replaced without any problem by other aromatic diamines in the range giving no adverse effect on the characteristics of the heat-resistant adhesive of the invention. Exemplary aromatic diamines which can replace the portion include
m-phenylenediamine,
o-phenylenediamine,
p-phenylenediamine,
m-aminobenzylamine,
p-aminobenzylamine,
bis(3-aminophenyl) sulfide,
(3-aminophenyl)(4-aminophenyl) sulfide,
bis(4-aminophenyl) sulfide,
bis(3-aminophenyl) sulfoxide,
(3-aminophenyl)(4-aminophenyl) sulfoxide,
bis(4-aminophenyl) sulfoxide,
bis(3-aminophenyl) sulfone,
(3-aminophenyl)(4-aminophenyl) sulfone,
bis(4-aminophenyl) sulfone,
3,3'-diaminobenzophenone,
3,4'-diaminobenzophenone,
4,4'-diaminobenzophenone,
3,3'-diaminodiphenylmethane,
3,4'-diaminodiphenylmethane,
4,4'-diaminodiphenylmethane,
4,4'-diaminodiphenyl ether,
3,3'-diaminodiphenyl ether,
3,4'-diaminodiphenyl ether,
bis [4-(3-aminophenoxy)phenyl] methane,
bis [4-(4-aminophenoxy)phenyl] methane,
1,1-bis [4-(4-aminophenoxy)phenyl] ethane,
1,2-bis [4-(3-aminophenoxy)phenyl] ethane,
1,2-bis [4-(4-aminophenoxy)phenyl] ethane,
2,2-bis [4-(3-aminophenoxy)phenyl] propane,
2,2-bis [4-(4-aminophenoxy)phenyl] propane,
2,2-bis [4-(3-aminophenoxy)phenyl] butane,
2,2-bis [3-(3-aminophenoxy)phenyl] -1,1,1,3,3,3-hexafluoropropane,
2,2-bis [4-(4-aminophenoxy)phenyl] -1,1,1,3,3,3-hexafluoropropane,
1,3-bis(3-aminophenoxy)benzene,
1,3-bis(4-aminophenoxy)benzene,
1,4-bis(3-aminophenoxy)benzene,
1,4-bis(4-aminophenoxy)benzene,
1,4'-bis(3-aminophenoxy)biphenyl,
1,4'-bis(4-aminophenoxy)biphenyl,
bis [4-(3-aminophenoxy)phenyl] ketone,
bis [4-(4-aminophenoxy)phenyl] ketone,
bis [4-(3-aminophenoxy)phenyl] sulfide,
bis [4-(4-aminophenoxy)phenyl] sulfide,
bis [4 (3-aminophenoxy)phenyl] sulfoxide,
bis [4-(4-aminophenoxy)phenyl] sulfoxide,
bis [4-(3-aminophenoxy)phenyl] sulfone,
bis [4-(4-aminophenoxy)phenyl] sulfone,
bis [4-(3-aminophenoxy)phenyl] ether,
bis [4-(4-aminophenoxy)phenyl] ether, 1,4-bis [4-(3-aminophenoxy)benzoyl] benzene,
1,3-bis [4-(3-aminophenoxy)benzoyl] benzene,
4,4'-bis [3-(4-aminophenoxy)benzoyl] diphenyl ether,
4,4'-bis [3-(3-aminophenoxy)benzoyl] diphenyl ether,
4,4'-bis [4-(4-amino-α,α-dimethylbenzyl)phenoxy] benzophenone,
4,4'-bis [4-(4-amino-α,α-dimethylbenzyl)phenoxy] diphenyl sulfone,
bis [4-{4-(3-aminophenoxy)phenoxy} phenyl] sulfone,
bis [4-{4-(4-aminophenoxy)phenoxy} phenyl] sulfone,
1,4-bis [4-(4-aminophenoxy)-α,α-dimethylbenzyl)benzene, and
1,3-bis [4-(4-aminophenoxy)-α,α-dimethylbenzyl)benzene.

These aromatic diamines can be used singly or as a mixture.

Further, in order to obtain polyimide or polyamic acid which can provide excellent adhesion properties for the adhesive of the invention under mild temperature and pressure conditions, the polymer chain end must be blocked with the aromatic dicarboxylic anhydride represented by the formula (1):

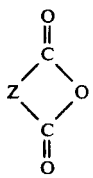

(1)

wherein Z is a divalent radical selected from the group consisting of a monoaromatic radical, condensed polyaromatic radical and noncondensed aromatic radical connected to each other with a direct bond or a bridge member.

The aromatic dicarboxylic acid anhydrides which can be used include, for example,
phthalic anhydride,
2,3-benzophenonedicarboxylic anhydride,
3,4-benzophenonedicarboxylic anhydride,
2,3-dicarboxyphenyl phenyl ether anhydride,
2,3-biphenyldicarboxylic anhydride,
3,4-biphenyldicarboxylic anhydride,
2,3-dicarboxyphenyl phenyl sulfone anhydride,
3,4-dicarboxyphenyl phenyl sulfone anhydride,
2,3-dicarboxyphenyl phenyl sulfide anhydride,
3,4-dicarboxyphenyl phenyl sulfide anhydride,
1,2-naphthalenedicarboxylic anhydride,
2,3-naphthalenedicarboxylic anhydride,
1,8-naphthalenedicarboxylic anhydride,
1,2-anthracenedicarboxylic anhydride,
2,3-anthracenedicarboxylic anhydride,
and 1,9-anthracene dicarboxylic anhydride.

The aromatic dicarboxylic anhydride may be substituted with a group which has no reactivity with amine or dicarboxylic anhydride. The preferred aromatic dicarboxylic anhydride is phthalic anhydride.

Alternatively, the polymer chain end must be blocked with the aromatic monoamine represented by the formula (3):

 Q—NH₂ (3)

wherein Q is a monovalent radical selected from the group consisting of a monoaromatic radical, condensed polyaromatic radical, noncondensed aromatic radical connected to each other with a direct bond or a bridge member.

Exemplary aromatic monoamines which can be used in the process include aniline, o-toluidine, m-toluidine, p-toluidine, 2,3-xylidine, 2,4-xylidine, 2,5-xylidine, 2,6-xylidine, 3,4-xylidine, 3,5-xylidine, o-chloroaniline, m-chloroaniline, p-chloroaniline, o-bromoaniline, m-bromoaniline, p-bromoaniline, o-nitroaniline, m-nitroaniline, p-nitroaniline, o-aminophenol, m-aminophenol, p-aminophenol, o-anisidine, m-anisidine, p-anisidine, o-phenetidine, m-phenetidine, p-phenetidine, o-aminobenzaldehyde, m-aminobenzaldehyde, p-aminobenzaldehyde, o-aminobenzonitrile, m-aminobenzonitrile, p-aminobenzonitrile, 2-aminobiphenyl, 3-aminobiphenyl, 4-aminobiphenyl, 2-aminophenyl phenyl ether, 3-aminophenyl phenyl ether, 4-aminophenyl phenyl ether, 2-aminobenzophenone, 3-aminobenzophenone, 4-aminobenzophenone, 2-aminophenyl phenyl sulfide, 3-aminophenyl phenyl sulfide, 4-aminophenyl phenyl sulfide, 2-aminophenyl phenyl sulfone, 3-aminophenyl phenyl sulfone, 4-aminophenyl phenyl sulfone, α-naphthylamine, β-naphthylamine, 1-amino-2-naphthol, 2-amino-1-naphthol, 4-amino-1-naphthol, 5-amino-1-naphthol, 5-amino-2-naphthol, 7-amino-2-naphthol, 8-amino-1-naphthol, 8-amino-7-naphthol, 8-amino-2-naphthol, 1-aminoanthracene, 2-aminoanthracene and 9-aminoanthracene.

Aniline is usually preferred of these aromatic monoamines. These aromatic monoamines can be used singly or as a mixture and can also be used without problem in combination with the above aromatic dicarboxylic anhydride.

The reaction for forming the polyimide is usually carried out in an organic solvent. Exemplary solvents which can be used include, for example, N-methyl-2-pyrrolidone, N,N-dimethylacetamide, N,N-dimethylformamide, 1,3-dimethyl-2-imidazolidinone, N,N-diethylacetamide, N,N-dimethylmethoxyacetamide, dimethyl sulfoxide, pyridine, dimethyl sulfone, hexamethylphosphoramide, tetramethylurea, N-methylcaprolactam, butyrolactam, tetrahydrofuran, 1,2-dimethoxyethane, bis(2-methoxyethyl) ether, 1,2-bis(2-methoxyethoxy)ethane, bis [2-(2-methoxy)ethoxy] ethyl ether, 1,3-dioxane, 1,4-dioxane, pyridine, picoline, dimethyl sulfoxide, dimethyl sulfone, o-cresol, m-cresol, p-cresol, cresylic acid, p chlorophenol, phenol and anisole.

These organic solvents can be used singly or as a mixture.

The polyamic acid and/or polyimide for use in the heat-resistant adhesive of the invention are prepared from the above aromatic diamine and the aromatic tetracarboxylic dianhydride by the following process in the presence of the aromatic dicarboxylic anhydride and/or the aromatic monoamine.

(A) APB of the formula (8), the aromatic tetracarboxylic dianhydride of the formula (9) and the aromatic dicarboxylic anhydride are reacted in the above organic solvent to obtain the polyamic acid precursor.

The amount of the aromatic tetracarboxylic dianhydride is in the range of 0.8 to 0.999 mole per mole of APB, and the amount of the aromatic dicarboxylic anhydride is preferably from 2to 8 moles for each mole of the difference between APB and the aromatic tetracarboxylic dianhydride.

When the amount of the aromatic tetracarboxylic dianhydride is less than 0.8 mole per mole of APB, the polymerization degree of the polymer is insufficient and heat resistance is impaired. On the other hand, an amount exceeding 0.999 mole makes blocking of the polymer chain end difficult and also renders adhesion under mild temperature and pressure conditions impossible. When the amount of the aromatic dicarboxylic anhydride is less than 2 moles of the difference, the polymer chain end cannot be blocked satisfactorily and an adhesive capable of adhering under mild temperature and pressure conditions cannot be obtained. On the other hand, an amount exceeding 8 moles per mole of the difference gives adverse effects on the heat resistance of the adhesive.

Particularly preferred amounts of the aromatic tetracarboxylic dianhydride are in the range of from 0.9 to 0.99 mole per mole of APB and that of the aromatic dicarboxylic acid anhydride is in the range of from 2 to 4 moles for each mole of the difference between APB and the aromatic tetracarboxylic dianhydride.

The addition and reaction of APB, the aromatic tetracarboxylic dianhydride and the aromatic dicarboxylic anhydride in the organic solvent is carried out by the following methods.

(a) A method for reacting the aromatic tetracarboxylic dianhydride with APB and successively adding the aromatic dicarboxylic anhydride to continue the reaction.

(b) A method for reacting APB with the aromatic dicarboxylic anhydride and successively adding the aromatic tetracarboxylic dianhydride to continue the reaction.

(c) A method for reacting the aromatic tetracarboxylic dianhydride, APB and the aromatic dicarboxylic anhydride at the same time. Any kind of addition and reaction method can be carried out.

The reaction temperature for preparing the polyamic acid is usually 60° C. or less, preferably 50° C. or less. No particular limitation is placed upon the reaction pressure. The reaction can be satisfactorily carried out at atmospheric pressure. The reaction time differs depending upon the kind of the aromatic tetracarboxylic dianhydride, the kind of the solvent and the reaction temperature. The reaction is carried out for a time sufficient to complete formation of the polyamic acid. A reaction time of 4 to 24 hours in usually sufficient.

The reaction provides the precursor of the polyimide, the polyamic acid represented by the formula (11):

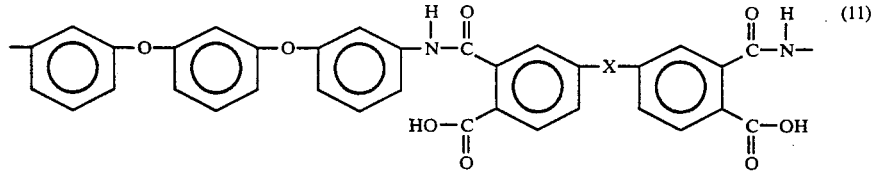

wherein X is a direct bond or a divalent radical of —CO— or —O—.

The polyamic acid thus obtained is further imidized by heating at 100° to 300° C. to obtain the polyimide. In the reaction, water generated by the imidizing reaction can be removed by azeotropic distillation with toluene or other organic solvents.

(B) The polyamic acid is prepared by the above process (A). Imidizing reaction is chemically carried out by the addition of an imidizing agent such as acetic anhydride to obtain polyimide. The imidizing reaction can be carried out, if desired, in the presence of a basic catalyst such as pyridine, picolines, imidazole, triethylamine and other tertiary amines. The imidizing reaction is carried out usually from room temperature to 200° C., preferably from room temperature to 100° C. A sufficient reaction time is from 0.5 to 24 hours.

(C) In the preparation of polyamic acid by the above process (A), the aromatic tetracarboxylic dianhydride, APB and the aromatic dicarboxylic anhydride are suspended or dissolved in the solvent and heated. Thus, the polyimide is obtained by simultaneously carrying out formation and imidization of the polyamic acid. The basic catalyst which can be used for the above process (B) can also be used for the imidizing reaction. Further, water generated in the imidizing reaction can be removed by azeotropic distillation with toluene. The temperature of the imidizing reaction is usually from 80° C. to the refluxing temperature of the solvent used, preferably from 80° C. to 200° C. A sufficient reaction time is in the range of 0.5 to 24 hours.

(D) The polyamic acid precursor of the polyimide is obtained by reacting APB of the formula (8), the aromatic tetracarboxylic dianhydride of the formula (5) and the aromatic dicarboxylic anhydride in the above organic solvent.

The amount of APB is from 0.8 to 0.999 mole per mole of the aromatic tetracarboxylic dianhydride. The amount of the aromatic monoamine is preferably from 2 to 8 moles for each mole of the difference between APB and the aromatic tetracarboxylic dianhydride.

When the amount of the APB is less than 0.8 mole per mole of the aromatic tetracarboxylic dianhydride, the polymerization degree of the polymer is insufficient and heat resistance of the adhesive is impaired. On the other hand, an amount of APB exceeding 0.999 mole makes blocking of the polymer chain end difficult and renders adhesion under mild temperature/mild pressure conditions impossible. When the amount of the aromatic monoamine is less than 2 moles per mole of the difference, blocking of polymer chain end cannot be conducted satisfactorily and an adhesive capable of adhering under mild temperature and pressure conditions cannot be obtained. On the other hand, an amount of the aromatic monoamine exceeding 8 moles per mole of the difference heat resistance of the adhesive.

Particularly preferred amounts of APB are from 0.9 to 0.99 mole per mole of the aromatic tetracarboxylic dianhydride, and that of the aromatic monoamine is from 2 to 4 moles for each mole of the difference between APB and the aromatic tetracarboxylic acid dianhydride.

In carrying out the process, APB, the aromatic tetracarboxylic dianhydride and the aromatic monoamine are added and reacted in the organic solvent by the following methods.

(e) The aromatic tetracarboxylic dianhydride is reacte with APB and successively the aromatic monoamine is added to continue the reaction.

(f) The aromatic tetracarboxylic dianhydride is reacted with the aromatic monoamine and successively APB is added to continue the reaction.

(g) The aromatic tetracarboxylic dianhydride, APB and the aromatic monoamine are added and reacted at the same time. Any of the above method can be carried out.

The reaction temperature for preparing the polyamic acid is usually 60° C. or less, preferably 50° C. or less. No particular limitation is imposed on the reaction pressure. The reaction can be satisfactorily carried out at atmospheric pressure. The reaction time depends upon the kind of the aromatic tetracarboxylic dianhydride, the kind of the solvent and the reaction temperature. The reaction is usually carried out for a time sufficient to complete formation of the polyamic acid. A sufficient reaction time is usually from 4 to 24 hours.

The polyamic acid precursor of the polyimide represented by the above formula (11) is obtained by the reaction.

The polyamic acid thus-obtained is further imidized by heating at 100° to 300° C. to obtain the polyimide. In the reaction, water generated by imidization can be removed by azeotropic distillation with toluene or other solvents.

(E) The polyamic acid is prepared by the above process (D). Imidizing reaction is chemically carried out by the addition of an imidizing agent such as acetic anhydride to obtain the polyimide. The imidizing reaction can be carried out, if desired, in the presence of a basic catalyst such as pyridine, picolines, imidazole, triethylamine and other tertiary amines. The imidizing reaction is carried out usually from room temperature to 200° C., preferably from room temperature to 100° C. A sufficient reaction time is from 0.5 to 24 hours.

(F) In the preparation of polyamic acid by the above process (D), the aromatic tetracarboxylic dianhydride, APB and the aromatic monoamine are suspended or dissolved in the solvent and heated. Thus, the polyimide is obtained by simultaneously carrying out formation and imidization of the polyamic acid. The basic catalyst which can be used for the above process (E) can also be used for the imidizing reaction. Further, water generated in the imidizing reaction can be removed by azeotropic distillation with toluene or other organic solvents. The temperature of the imidizing reaction is usually from 80° C. to the refluxing temperature of the solvent used, preferably from 80° to 200° C. Sufficient reaction time is in the range of 0.5 to 24 hours.

By one of the above processes (A) to (F), the polyimide having recurring structural units represented by the formula (12) can be obtained.

The term varnish which substantially comprises the polyamic acid and a good solvent for the polyamic acid includes a solution obtained by dissolving the polyamic acid in a solvent.

The solvent used for the polyamic acid forming reaction is usually applied as intact to the solvent for dissolving the polyamic acid, and hence the varnish comprises as a primary component the polyamic acid obtained by reacting APB, the tetracarboxylic dianhydride, the aromatic dicarboxylic acid anhydride and/or the aromatic monoamine in the organic solvent and can also contain the polyimide which is a cyclized product of the polyamic acid. Consequently, the polyamic acid containing solution includes a solution or suspension containing polyimide as one of the components. The adhesive having such embodiment exhibits an excellent bonding effect by applying to an adherend and successively converting the polyamic acid to the polyimide with a means such as heating.

(2) An adhesive in the form of polyimide is the polyimide itself obtained by subjecting the polyamic acid to thermal or chemical dehydration-ring closure and thereafter processing, for example, into films or pellets. The adhesive can contain the polyamic acid as a part of the component.

The adhesive is used by attaching to the adherend, heat-melting and pressing.

(3) Polyimide is isolated from the reaction mixture containing the polyimide obtained in one of the processes (A) to (F). Polyimide is precipitated by pouring the reaction mixture into a lean solvent or adding the lean solvent to the reaction mixture. Alternatively, solvent, catalyst and other materials, remaining in the reaction system except polyimide are removed by heating and/or under reduced pressure.

Thus-isolated polyimide is dissolved in a suitable solvent to prepare a solution of polyimide. The polyimide solution is substantially used as the heat-resistant adhesive.

Exemplary solvents are the same as the above solvents used for the polymerization, and include N-methyl-2-pyrrolidone, N,N-dimethylacetamide, N,N-dimethylformamide, 1,3-dimethyl-2-imidazolidinone, N,N-diethylacetamide, N,N-dimethylmethoxyacetamide, dimethyl sulfoxide, pyridine, dimethyl sulfone, hexamethylphosphoramide, tetramethylurea, N-methylcaprolactam, butyrolactam, tetrahydrofuran, 1,2-dimethoxyethane, bis(2-methoxyethyl) ether, 1,2-bis(2-methoxyethoxy)ethane, bis [2-(2-methoxy)ethoxy] ethyl

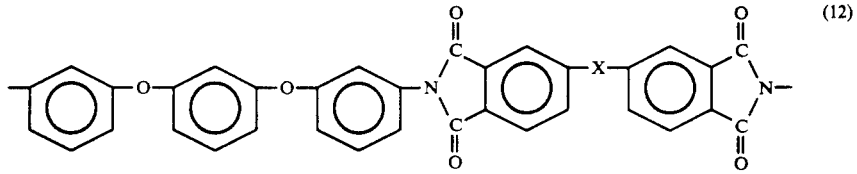

(12)

wherein X is a direct bond or a divalent radical of —CO— or —O—.

The adhesive of the present invention comprises the polyamic acid and/or the polyimide thus obtained and can be applied to practical use by the following embodiments.

(1) A varnish which substantially comprises the above polyamic acid of the invention and a good solvent for the polyamic acid is applied as the heat resistant adhesive.

ether, 1,3-dioxane, 1,4-dioxane, pyridine, picoline, dimethyl sulfoxide, dimethyl sulfone, o-cresol, m-cresol, p-cresol, cresylic acid, p-chlorophenol, phenol and anisole.

These organic solvents can be used singly or as a mixture.

Solvents which are suitable for the stated objects are selected from those solvents.

The adhesive of the invention is used by dissolving the above-obtained polyimide in an organic solvent in an amount of from 1 to 50% by weight, preferably from 5 to 30% by weight.

(4) In the preparation of the polyimide by one of the above processes (A) to (F), when the polyimide formed is dissolved in the solvent used for the polymerization and imidization reaction, the reaction mixture obtained after the imidizing reaction can be used as intact for the heat-resistant adhesive.

Consequently, the polyamic acid precursor of the polyimide can be contained in the range giving no adverse effect on the characteristics of the adhesive of the invention.

The heat-resistant adhesive of the invention can be used for adhesion by the following method.

When the adhesive is a varnish containing the polyamic acid or the polyamic acid and polyimide which are prepared by the above process (A) or (E), the varnish is applied in a thin layer to an adherend to be laminated and successively heated at 100° to 300° C. for a prescribed time in air. Thus, an excessive solvent is removed and the polyamic acid is converted to more stable polyimide. Thereafter the adherend is pressed under pressure of 1 to 1000 kg/cm$^2$ at temperature of 100° to 400° C. and cured at 100° to 400° C. to obtain firm adhesion.

When the adhesive is a film or powder and is substantially composed of the polyimide, the film or powder is inserted between the adherends and pressed under pressure of 1 to 1000 kg/cm$^2$ at temperature of 100° to 400° C. and cured at temperature of 100° to 400° C. to obtain firm adhesion.

When the adhesive is a solution containing the polyimide in an organic solvent, the adhesive is applied to an adherend to be laminated and successively heated at temperature of 100° to 300° C. for a prescribed time to remove the solvent.

In the case of heat-resistant adhesive of the above (4), the catalyst remaining in the system is also removed together with the solvent. Thereafter the coated surface of the adherend is overlapped with another adherend and pressed under pressure of 1 to 1000 kg/cm$^2$ at temperature of 100° to 400° C., preferably 150° to 300° C. to obtain firm adhesion of the adherends to each other. As to application of the heat-resistant adhesive to the adherend surface to be laminated, a good bonding effect can be obtained by applying the adhesive to one adherend surface alone or by applying the adhesive to surfaces of the adherends.

The heat-resistant adhesive of the invention can be used by impregnating the adhesive into a glass fiber cloth or a carbon fiber cloth with known methods and successively by inserting the thus-impregnated cloth between the adherends. Alternatively, the adhesive is applied to one of the adherends, a glass fiber cloth or a carbon fiber cloth is submerged into the coated layer of the adhesive and successively another adherend can be overlapped and pressed.

Adhesion can also be carried out after chemically or physically treating the adherend surface. Methods of surface treatment include chemical etching with alkali, corona discharge treatment, ultraviolet light irradiation, radiation exposure, sandblasting, heat treatment, plasma treatment, abrasion, honing, plating, surface oxide treatment and degreasing.

These methods of surface treatment can be carried out singly or in combination.

Other resins can be added to the adhesive as long as giving no adverse effect on the characteristics of the heat resistant adhesive of the invention. The resins which can be added include, for example, nylons, polyacetal, polycarbonate, polyphenyleneoxide, polyethylene terephthalate, polysulfone, polyethersulfone, polyarylate, polyamideimide, polyetherimide, polyetheretherketone, a polyimide exclusive of the polyimide of the invention, fluoro resin, polybismaleimide and epoxy resin.

Various additives can be added to the heat-resistant adhesive of the invention in the range not impairing the object of the invention.

Exemplary additives which can be added include solid lubricants such as molybdenum disulfide, graphite, boron nitride, lead monoxide and lead powder; reinforcements such as glass fiber, carbon fiber, aromatic polyamide fiber, potassium titanate fiber and glass beads; antioxidants, heat stabilizers, ultraviolet absorbers, flame retardants, auxiliary flame retardants, antistatics and colorants. The additives can be used singly or as a mixture.

The present invention will hereinafter be illustrated further in detail by way of examples.

EXAMPLE 1

To a reaction vessel equipped with a stirrer, reflux condenser and a nitrogen inlet tube, 29.2 g (0.1 mole) of APB and 183.9 g of N,N-dimethylacetamide were charged. To the solution, 30.91 g (0.096 mole) of 3,3',4,4'-benzophenonetetracarboxylic dianhydride were added by portions at room temperature in a nitrogen atmosphere with caution to prevent temperature rise of the solution and stirred at room temperature for 20 hours. Thereafter 1.184 g ($8 \times 10^{-3}$ mole) of phthalic anhydride were added and stirred for 4 hours at room temperature. The polyamic acid thus obtained had an inherent viscosity of 0.49 dl/g at 35° C. in a 0.5% N,N-dimethylacetamide solution. The above polyamic acid adhesive solution was applied to Kapton 200 H(Trade Mark of E. I. Du Pont de Nemours &. Co) which was previously washed with ethanol and dried by heating in a nitrogen atmosphere at 150° C. for an hour and at 250° C. for 3 hours. Thereafter a copper foil having a thickness of 25 μm was overlapped and pressed at 280° C. for 5 minutes under a pressure of 5 kg/cm$^2$.

The coated adhesive had a thickness of 25 μm and a 180° peel strength of 2.8 kg/cm at room temperature in accordance with JPCA-BOM 01.

The above polyamic acid solution was cast on a glass plate and heated in a nitrogen atmosphere at 150° C. for an hour and at 250° C. for 2 hours to obtain a yellow transparent polyimide film. The polyimide film had a glass transition temperature of 186° C. in accordance with TMA penetration method. The polyimide film was inserted between PI-X/CF composite plates (10×79×2.5 mm, Vf=60%) manufactured by Mitsui Toatsu Chemicals Inc. and pressed at 300° C. for 10 minutes under a pressure of 50 kg/cm$^2$. The specimen thus obtained had a compressive shear strength of 3.7 kg/mm$^2$ in accordance with ASTM D2733.

Further, 50.2 g of N,N-dimethylacetamide was added to 75.4 g of the polyamic acid solution and successively 12.3 g (0.12 mole) of acetic anhydride and 9.56 g (0.09 mole) of triethylamine were added and continuously stirred. After stirring for about 10 hours, the reaction mixture was poured into 500 ml of methanol. The precipitate was filtered, washed with methanol and acetone, and dried at 180° C. for 12 hours to obtain 16.3 g (96% yield) of polyimide powder.

The polyimide powder was inserted between cold rolled steel plates (JIS G3141, Spec/SD25×100×1.6 mm) which were preheated to 130° C. and pressed at 290° C. for 10 minutes under a pressure of 10 kg/cm². The specimen thus obtained had a tensile shear strength of 280 kg/cm².

COMPARATIVE EXAMPLE 1

A polyamic acid varnish was prepared by carrying out the same procedures as described in Example 1 except that phthalic anhydride was omitted. The polyamic acid had an inherent viscosity of 0.49 dl/g. The polyamic acid adhesive had a low peel strength of 0.3 kg/cm, which was measured by the same procedures as Example 1.

Further, the polyamic acid solution was cast on a glass plate and heated at 150° C. for an hour and at 250° C. for 2 hours to obtain a light yellow transparent polyimide film.

By the same procedures as described in Example 1, the polyimide film was inserted between the plates and pressed at 300° C. for 10 minutes under a pressure of 50 kg/cm² to obtain a specimen. The specimen had a compressive shear strength of 0.2 kg/mm². The strength was low as compared with that of Example 1. When the specimen was prepared by pressing at 370° C., the compressive shear strength was only 1.8 kg/mm².

EXAMPLE 2

To a reaction vessel equipped with a stirrer, reflux condenser, water separator and a nitrogen inlet tube 29.2 g (0.1 mole) of APB and 30.91 g (0.096 mole) of 3,3',4,4'-benzophenonetetracarboxylic dianhydride, 1.184 g (8×10⁻³ mole) of phthalic anhydride, 1.40 g of γ-picoline and 245 g of m-cresol were charged and heated to 145° C. with stirring in a nitrogen atmosphere. In the heating stage, 3.5 cc of water was distilled out. Thereafter the reaction mixture was cooled to room temperature, poured into 3 l of methyl ethyl ketone and filtered. The filtrate was washed with methyl ethyl ketone and dried at 180° C. for 12 hours under reduced pressure to obtain 56.5 g (yield 98%) of polyimide powder.

The polyimide powder was inserted between PI-X/CF composite panels as used in Example 1 and heat-pressed under the same conditions as Example 1. The specimen thus-obtained had a compressive shear strength of 3.8 kg/mm².

EXAMPLES 3-7

Polyamic acid varnishes were obtained by individually using the tetracarboxylic acid dianhydride and the aromatic dicarboxylic acid anhydride illustrated in Table 1 in an amount illustrated in Table 1 respectively.

The solutions of the polyamic acid adhesives were applied to Kapton 200 H, dried under the same conditions as Example 1, overlapped and pressed with a copper foil under the same conditions as Example 1.

The 180° peel strength of these specimens thus-obtained was measured. The results obtained are illustrated in Table 1.

COMPARATIVE EXAMPLES 2-5

The same procedures as described in Example 1 were carried out by using the tetracarboxylic acid dianhydrides and the dicarboxylic acid anhydrides illustrated in Table 1 in an amount illustrated in Table 1, respectively, to obtain polyamic acid solutions. These adhesive solutions were applied to Kapton 200 H and dried under the same conditions as used in Example 1. Thereafter copper foils were individually overlapped and pressed under the same conditions as used in Example 1, respectively. The 180° peel strength of the specimens thus-obtained were measured. Inherent viscosity of polyamic acid thus-obtained and 180° peel strength of specimens are summarized in Table 1.

EXAMPLE 8

To a reaction vessel equipped with a stirrer, reflux condenser, and a nitrogen inlet tube, 29.2 g (0.1 mole) of APB and 245.6 g of N,N-dimethylacetamide were charged and dissolved by stirring at room temperature in a nitrogen atmosphere. To the solution, 31.87 g (0.099 mole) of 3,3',4,4'-benzophenonetetracarboxylic dianhydride were added by portions with caution to prevent temperature rise of the solution and stirred for 20 hours at room temperature. Thereafter 1.184 g (8×10⁻² mole) of phthalic anhydride were added and further stirred for 4 hours at room temperature. The polyamic acid thus-obtained had an inherent viscosity of 0.75 dl/g at 35° C. in a 0.5% N,N-dimethylacetamide solution. To the polyamic acid solution, 40.8 g (0.4 mole) of acetic anhydride and 20.2 g (0.2 mole) of triethylamine were dropwise added and stirred for 10 hours at room temperature. The reaction mixture obtained was poured into 1000 g of methanol with vigorous stirring and resulting precipitate was filtered, washed with methanol, and dried at 180° C. for 12 hours to obtain 56.9 g (99% yield) of polyimide powder.

The polyimide powder had a glass transition temperature of 192° C. according to DSC and an inherent viscosity of 0.76 dl/g at 35° C. in a 0.5% solution of a p-chlorophenol/phenol =9/1 by weight mixture. A polyimide varnish was prepared by dissolving 20 g of the polyimide powder thus obtained in 80 g of N-methyl-2-pyrrolidone (concentration was 20%).

The polyimide varnish was applied to Kapton 200 H (manufactured by E. I. Du Pont de Nemours & Co.) which was previously washed with ethanol, dried at 250° C. for 30 minutes in the nitrogen atmosphere, overlapped with a rolled copper foil having a thickness of 25 μm and pressed at 250° C. for 5 minutes under a pressure of 50 kg/cm². The coated layer of polyimide had thickness of 10 μm. The specimen had a 180° peel strength of 3.3 kg/cm at room temperature in accordance with JPCA-B0M 01. The polyimide varnish was applied to a cold rolled steel panel (JIS, G3141, spec/SD 25×100×1.6 mm), dried at 250° C. for 30 minutes in a nitrogen atmosphere. The coated steel panel was overlapped with another cold rolled steel panel and pressed at 250° C. for 5 minutes under a pressure of 50 kg/cm². The specimen had a tensile shear strength of 320 kg/cm² in accordance with JIS K 6848 and K 68501.

EXAMPLES 9 AND 10

Polyamic acid and polyimide powder were prepared by using tetracarboxylic acid dianhydrides illustrated in Table 2 in place of 3,3',4,4'-benzophenone tetracarboxylic dianhydride used in Example 8 and carrying out the same procedures as described in Example 8. Further, a solution of polyimide was prepared and same evaluations as described in Example 1 were carried out. Results are illustrated in Table 2.

COMPARATIVE EXAMPLE 6

Polyamic acid was prepared by carrying out the same procedures as described in Example 8. The polyamic acid solution was applied to Kapton 200 H (Manufactured by E. I. Du Pont de Nemours &, Co.) which was previously washed with ethanol, heated at 150° C. for an hour and at 250° C. for 3 hours in a nitrogen atmosphere, overlapped with a rolled copper foil having a thickness of 25 μm and pressed at 250° C. for 5 minutes under a pressure of 50 kg/cm$^2$. The test specimen thus obtained had a tensile impact strength of 270 kg/cm$^2$.

COMPARATIVE EXAMPLES 7 AND 8

The same procedures as described in Comparative Example 6 were carried out except that 3,3',4,4'-benzophenonetetracarboxylic dianhydride was replaced by tetracarboxylic acid dianhydrides illustrated in Table 2. Results are illustrated in Table 2.

COMPARATIVE EXAMPLE 9

Polyamic acid having an inherent viscosity of 0.75 dl /g was prepared by carrying out the same procedures as described in Example 8. The polyamic acid was cast on a glass plate and heated at 150° C. for an hour and at 250° C. for 2 hours in the nitrogen atmosphere to obtain a yellow transparent film.

The polyimide film had a glass transition temperature of 187° C. in accordance with TMA penetration method and a thickness of 10 μm. The polyimide film thus obtained was inserted between a copper foil and Kapton 200 H which were used in Example 8 and pressed at 250° C. for 5 minutes under a pressure of 50 kg/cm$^2$, and the 180° peel strength was measured. The polyimide film was also inserted between cold rolled steel plates as used in Example 8 and pressed at 250° C. for 5 minutes under a pressure of 50 kg/cm$^2$. Tensile shear strength of the specimen thus obtained was measured. Results are illustrated in Table 2.

COMPARATIVE EXAMPLE 10

A paste like suspension was prepared by mixing 10 g of the polyimide powder obtained in Example 8 with 10 g of methanol. The suspension is applied to a rolled copper foil and a cold rolled steel plate and methanol is removed by heating at 70° C. for 20 minutes. The coated copper foil and the steel plate were individually adhered by the same conditions as described in Example 8, and 180° C. peel strength and tensile shear strength were measured. Results are illustrated in Table 2.

COMPARATIVE EXAMPLE 11

Polyamic acid was prepared by carrying out the same procedures as described in Example 8 except that phthalic anhydride was omitted. The polyamic acid obtained had an inherent viscosity of 0.74 dl /g. Further, the same procedures as described in Example 8 were carried out to obtain 56.7 g (99% yield) of polyimide powder. The polyimide powder had an inherent viscosity of 0.75 d l /g. The polyimide powder was mixed with N-methyl-2-pyrrolidone by the same procedures as described in Example 8. However, the polyimide powder was insoluble in N-methyl-2-pyrrolidone and the solution could not be obtained.

EXAMPLE 11

The same procedures as described in Example 8 were carried out except that 1.184 g (8×10$^{-3}$ mole) of phthalic anhydride was replaced by 1.585 g (8×10$^{-3}$ mole) of 2,3-naphthalenedicarboxylic anhydride. Polyamic acid having an inherent viscosity of 0.75 dl /g and its solution, and polyimide powder having an inherent viscosity of 0.76 d l/g and a glass transition temperature of 192° C. were obtained. Further, a solution of polyimide in N-methyl-2-pyrrolidone was prepared and adhesive strength was measured by the same procedures as carried out in Example 8. Results are illustrated in Table 2.

EXAMPLE 12

To a reaction vessel equipped with a stirrer, reflux condenser and a nitrogen inlet tube, 29.2 g (0.1 mole) of APB, 245.6 g of m-cresol, 1.4 g of γ-picoline and 31.87 g (0.099 mole) of 3,3',4,4'-benzophenonetetracarboxylic dianhydride were charged and heated to 150° C. with stirring in a nitrogen atmosphere while distilled water as a result of the imidizing reaction was trapped in a water separator. The temperature of the reaction system was maintained at 150° C. for 2 hours, 1.184 g (8×10$^{-3}$ mole) of phthalic anhydride was added, and stirring was further continued for 2 hours at the same temperature. The reaction mixture was cooled to room temperature to obtain a polyimide varnish. A portion of the polyimide varnish was poured into methanol and the precipitate was washed with methanol and dried at 180° C. for 12 hours. The polyimide powder thus obtained had an inherent viscosity of 0.75 dl /g and a glass transition temperature of 191° C. in accordance with DSC.

Another portion of the reaction mixture was used as a polyimide varnish as such. The varnish was applied to Kapton 200 H (manufactured by E. I. Du Pont de Nemours &. Co.) which was previously washed with ethanol, dried at 250° C. for 30 minutes in a nitrogen atmosphere, overlapped with a rolled copper foil having a thickness of 25 μm and pressed at 250° C. for 5 minutes under a pressure of 50 kg/cm$^2$.

The coated polyimide layer had a thickness of 10 μm. The 180° peel strength of the specimen was 32 kg/cm at room temperature.

The polyimide varnish was applied to a cold rolled steel plate, dried by heating at 250° C. for 30 minutes in the nitrogen atmosphere, and successively another cold rolled steel panel was overlapped on the coated surface thus obtained and pressed at 250° C. for 5 minutes under a pressure of 50 kg/cm$^2$. The specimen thus obtained had a tensile shear strength of 315 kg/cm$^2$.

EXAMPLE 13

To a reaction vessel equipped with a stirrer, reflux condenser and a nitrogen inlet tube, 32.2 g (0.1 mole) of 3,3',4,4'-benzophenonetetracarboxylic dianhydride and 245.6 g of N,N-dimethylacetamide were charged and stirred at the room temperature in a nitrogen atmosphere. To the solution thus obtained, 28.9 g (0.099 mole) of APB was added by portions with caution to prevent temperature rise of the solution and stirred for 20 hours at room temperature. Thereafter 0.745 g (8×10$^{-3}$ mole) of aniline was added and further stirred for 4 hours. The polyamic acid thus obtained had an inherent viscosity of 0.73 dl /g.

The polyamic acid solution was imidized by using acetic anhydride and triethylamine as carried out in Example 8. Polyimide powder thus obtained was 56.6 g (98% yield) and had a glass transition temperature of 191° C. and an inherent viscosity of 0.74 dl/g. A polyimide solution was prepared by dissolving the polyimide powder in N-methyl-2-pyrrolidone as carried out in Example 8. Specimens were prepared by using the polyimide solution as carried out in Example 8, and 180° peel strength and tensile shear strength were measured. The results are illustrated in Table 2.

EXAMPLES 14 AND 15

The same procedures as described in Example 13 were carried out except that 3,3′,4,4′-benzophenonetetracarboxylic dianhydride was replaced by tetracarboxylic acid dianhydrides illustrated in Table 2.

Results are illustrated in Table 2.

EXAMPLE 16

The same procedures as described in Example 13 were carried out except that 0.745 g ($8 \times 10^{-3}$ mole) of aniline was replaced by 1.578 g ($8 \times 10^3$ mole) of 4-aminobenzophenone. Results are illustrated in Table 2.

COMPARATIVE EXAMPLE 12

Polyamic acid was prepared by carrying out the same procedures as described in Example 13. The polyamic acid solution was applied to Kapton 200 H (manufactured by E. I. Du Pont de Nemours &. Co.) which was previously washed with ethanol and heated at 150° C. for an hour and 250° for 3 hours. A rolled copper sheet having a thickness of 25 μm was overlapped on the coated surface of Kapton 200 H and pressed at 250° C. for 5 minutes under pressure of 50 kg/cm². The thickness of the coated adhesive was 25 μm. The specimen thus obtained had a 180° peel strength of 2.5 kg/cm at the room temperature.

The polyamic acid solution was applied to a cold rolled steel panel and dried at 150° C. for an hour and at 250° C. for 3 hours in a nitrogen atmosphere. Thereafter, another cold rolled steel panel was overlapped on the coated surface and pressed at 250° C. for 5 minutes under a pressure of 50 kg/cm². The specimen thus obtained had a tensile shear strength of 270 kg/cm².

TABLE 1

|  | Diamine g (mole) | Tetracarboxylic dianhydride g (mole) | Dicarboxylic anhydride g (mole) | Polyamic acid η (dl/g) | 180° Peel strength (kg/cm) |
|---|---|---|---|---|---|
| Ex. 3 | APB[*1] 29.2 (0.1) | BPDA[*2] 28.2 (0.096) | Phthalic anhydride 1.184 ($8 \times 10^{-3}$) | 0.51 | 2.5 |
| Ex. 4 | ↑ | ODPA[*3] 29.76 (0.096) | ↑ | 0.50 | 3.0 |
| Ex. 5 | ↑ | BTDA[*4] 30.91 (0.096) | 3,4-Benzophenone-dicarboxylic anhydride 2.02 ($8 \times 10^{-3}$) | 0.49 | 2.9 |
| Ex. 6 | ↑ | ↑ | 3,4-Biphenyl-dicarboxylic anhydride 1.79 ($8 \times 10^{-3}$) | 0.48 | 2.5 |
| Ex. 7 | ↑ | ↑ | 3,4-Biphenyl-etherdicarboxylic anhydride 1.92 ($8 \times 10^{-3}$) | 0.49 | 2.8 |
| Comp. Ex. 2 | ↑ | ↑ | Phthalic anhydride 0.355 ($2.4 \times 10^{-3}$) | 0.50 | 0.7 |
| Comp. Ex. 3 | ↑ | ↑ | Phthalic anhydride 7.104 ($4.8 \times 10^{-3}$) | 0.18 | 0.2 |
| Comp. Ex. 4 | ↑ | BPDA 28.2 (0.096) | 0 | 0.50 | 0.5 |
| Comp. Ex. 5 | ↑ | ODPA 29.76 (0.096) | 0 | 0.50 | 0.7 |

Note:
[*1] 1,3-Bis(3-aminophenoxy)benzene
[*2] 3,3′,4,4′,-Biphenyltetracarboxylic dianhydride
[*3] 3,3′,4,4′,-Diphenylethertetracarboxylic dianhydride
[*4] 3,3′,4,4′,-Benzophenonetetracarboxylic dianhydride

TABLE 2

|  | Diamine g (mole) | Tetracarboxylic dianhydride g (mole) | Blocking agent g (mole) | Polyamic acid inherent viscosity (dl/g) | Polyimide inherent viscosity (dl/g) |
|---|---|---|---|---|---|
| Ex. 8 | APB[*1] 29.2 (0.1) | BPDA[*2] 31.87 (0.099) | Phthalic anhydride 1.184 ($8 \times 10^{-3}$) | 0.75 | 0.76 |
| Ex. 9 | ↑ | BPDA[*3] 29.11 | ↑ | 0.78 | 0.77 |

TABLE 2-continued

| | | | | | |
|---|---|---|---|---|---|
| Ex. 10 | ↑ | ODPA*4 30.69 (0.099) | ↑ | 0.83 | 0.82 |
| Ex. 11 | ↑ | BTDA 31.87 (0.099) | Naphthalene-dicarboxylic anhydride 1.585 ($8 \times 10^{-3}$) | 0.75 | 0.76 |
| Ex. 12 | ↑ | ↑ | Phthalic anhydride 1.184 ($8 \times 10^{-3}$) | — | 0.75 |
| Ex. 13 | APB 28.9 (0.099) | BTDA 32.2 (0.1) | Aniline 0.745 ($8 \times 10^{-3}$) | 0.73 | 0.74 |
| Ex. 14 | ↑ | BPDA 29.40 (0.1) | ↑ | 0.79 | 0.78 |
| Ex. 15 | ↑ | ODPA 31.00 (0.1) | ↑ | 0.85 | 0.84 |
| Ex. 16 | ↑ | BTDA 32.20 (0.1) | 4-Amino-benzophenone 1.578 ($8 \times 10^{-3}$) | 0.74 | 0.75 |
| Comp. Ex. 6 | APB 29.2 (0.1) | BTDA 31.87 (0.099) | Phthalic anhydride 1.184 ($8 \times 10^{-3}$) | 0.75 | — |
| Comp. Ex. 7 | ↑ | BPDA 29.11 (0.099) | ↑ | 0.78 | — |
| Comp. Ex. 8 | ↑ | ODPA 30.69 (0.099) | ↑ | 0.83 | — |
| Comp. Ex. 9 | ↑ | BTDA 31.87 (0.099) | ↑ | 0.75 | — |
| Comp. Ex. 10 | ↑ | ↑ | ↑ | 0.75 | 0.76 |
| Comp. Ex. 11 | ↑ | ↑ | ↑ | 0.74 | — |
| Comp. Ex. 12 | APB 28.9 (0.099) | BTDA 32.20 (0.1) | Aniline 0.745 ($8 \times 10^{-3}$) | 0.78 | — |

| | | Kapton/copper foil | | Between cold rolled steel panels | |
|---|---|---|---|---|---|
| | | Application method | 180° Peel strength (kg/cm) | Application method | Tensile shear strength (kg/cm$^2$) |
| | Ex. 8 | Solution of polyimide powder | 3.3 | Solution of polyimide powder | 320 |
| | Ex. 9 | ↑ | 2.9 | ↑ | 315 |
| | Ex. 10 | ↑ | 3.2 | ↑ | 310 |
| | Ex. 11 | ↑ | 3.3 | ↑ | 320 |
| | Ex. 12 | Solution of polyimide reaction mixture | 3.2 | Solution of polyimide reaction mixture | 315 |
| | Ex. 13 | Solution of polyimide powder | 3.3 | Solution of polyimide powder | 320 |
| | Ex. 14 | ↑ | 3.0 | ↑ | 315 |
| | Ex. 15 | ↑ | 3.1 | ↑ | 305 |
| | Ex. 16 | ↑ | 3.3 | ↑ | 325 |
| | Comp. Ex. 6 | Polyamic acid solution | 2.6 | Polyamic acid solution | 270 |
| | Comp. Ex. 7 | ↑ | 2.4 | ↑ | 260 |
| | Comp. Ex. 8 | ↑ | 2.4 | ↑ | 260 |
| | Comp. Ex. 9 | Polyimide film | 2.3 | Polyimide film | 250 |
| | Comp. Ex. 10 | Polyimide powder | 2.3 | Polyimide powder | 240 |
| | Comp. Ex. 11 | impossible | — | impossible | — |
| | Comp. Ex. 12 | Polyamic acid | 2.5 | Polyamic acid solution | 270 |

TABLE 2-continued

| solution |
| --- |

Note:
*¹1,3-Bis(3-aminophenoxy)benzene
*²3,3',4,4',-Benzophenonetetracarboxylic dianhydride
*²3,3',4,4',-Biphenyltetracarboxylic dianhydride
*⁴3,3',4,4',-Diphenylethertetracarboxylic dianhydride

What is claimed is:

1. A heat-resistant adhesive comprising polyamic acid and/or polyimide which are blocked at the polymer chain end with an aromatic dicarboxylic anhydride represented by the formula (1):

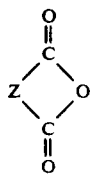
(1)

wherein Z is a divalent radical selected from the group consisting of a monoaromatic radical, condensed polyaromatic radical and noncondensed aromatic radical connected to each other with a direct bond or a bridge member, and essentially consist of recurring structural units represented by the formula (2):

(2)

wherien Y is:

or wherein X is a direct bond or a divalent radical of —CO— or —O—.

2. The heat-resistant adhesive of claim 1 wherein the aromatic dicarboxylic anhydride represented by the formula (1) is phthalic anhydride.

3. A polyimide-base heat-resistant adhesive comprising dissolving a polyimide in a soluble solvent, the polyimide of which is blocked at the polymer chain end with an aromatic dicarboxylic anhydride represented by the formula (1):

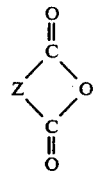
(1)

wherein Z is a divalent radical selected from the group consisting of a monoaromatic radical, condensed polyaromatic radical and noncondensed aromatic radical connected to each other with a direct bond or a bridge member, and essentially consists of recurring structural units represented by the formula (2):

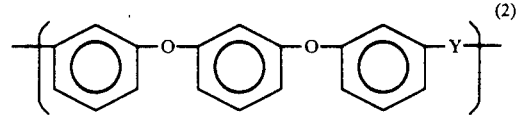
(2)

wherein Y is:

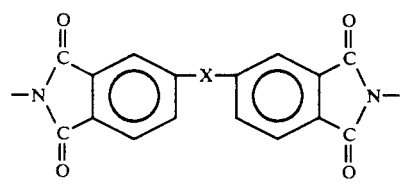

wherin X is a direct bond or a divalent radical of —CO— or —O—.

4. The heat-resistant adhesive of claim 3 wherien the aromatic dicarboxylic anhydride represented byt he formula (1) is phthalic anhydride.

5. An adhesion method comprising usign a polyimide solution containing the polyimide in a soluble solvent, the polyimide of which is blocked at the polymer chain end with an aromatic dicarboxylic anhydride represented by the formula (1):

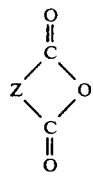
(1)

wherein Z is a divalent radical selected from the group consisting of a monoaromatic radical, condensed polyaromatic radical and noncondensed aromatic radical connected to each other with a direct bond or a bridge member, and essentially consists of recurring structural units represented by the formula (2):

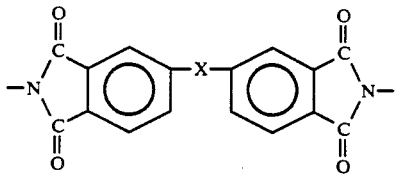

wherein X is a direct bond or a divalent radical of —CO— or —O—.

6. The adhesion method of claim 5 wherien the aromatic dicarboxylic anhydride is phthalic anhydride.

7. The heat-resistant adhesive of claim 1 wherin the polyamic acid and/or the polyimide is a mixutre of more than two recurring structural units of formula (2).

8. The heat-resistant adhesive of claim 3 wherein the polyimide is a mixture of mroe than two recurring structural units of formula (2).

9. The adhesion method of claim 5 wherein the polyimide is a mixture of more than two recurring structural units of formula (2).

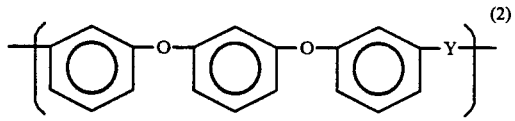

wherein Y is:

UNITED STATES PATENT AND TRADEMARK OFFICE
CERTIFICATE OF CORRECTION

PATENT NO. : 5,252,700
DATED : October 12, 1993
INVENTOR(S) : Okikawa et al

It is certified that error appears in the above-identified patent and that said Letters Patent is hereby corrected as shown below:

Claim 1, column 23 line 38, "wherien" should be --wherein--.

Claim 3, column 24, line 42, "wherin" should be --wherein--.

Claim 4, column 24, line 44, "wherien" should be --wherein--;

Claim 4, column 24, line 45, "byt he" should be --by the--.

Claim 5, line 47, "usign" should be --using--.

Signed and Sealed this

Eighteenth Day of October, 1994

Attest:

BRUCE LEHMAN

Attesting Officer  Commissioner of Patents and Trademarks